(12) United States Patent
Kao et al.

(10) Patent No.: US 12,464,787 B2
(45) Date of Patent: Nov. 4, 2025

(54) CIRCUIT STRUCTURE AND METHOD FOR REDUCING ELECTRONIC NOISES

(71) Applicant: Taiwan Semiconductor Manufacturing Co., Ltd., Hsin-Chu (TW)

(72) Inventors: Ching-Hung Kao, Tainan (TW); Chi-Feng Huang, Hsinchu County (TW); Fu-Huan Tsai, Kaohsiung (TW); Victor Chiang Liang, Hsinchu (TW)

( * ) Notice: Subject to any disclaimer, the term of this patent is extended or adjusted under 35 U.S.C. 154(b) by 299 days.

(21) Appl. No.: 18/182,508

(22) Filed: Mar. 13, 2023

(65) Prior Publication Data

US 2023/0215916 A1 Jul. 6, 2023

Related U.S. Application Data

(60) Continuation of application No. 17/121,062, filed on Dec. 14, 2020, now Pat. No. 11,605,709, which is a
(Continued)

(51) Int. Cl.
*H10D 62/10* (2025.01)
*H10D 30/01* (2025.01)
(Continued)

(52) U.S. Cl.
CPC ......... *H10D 62/116* (2025.01); *H10D 30/022* (2025.01); *H10D 30/0227* (2025.01); *H10D 30/0281* (2025.01); *H10D 30/601* (2025.01); *H10D 30/603* (2025.01); *H10D 30/65* (2025.01); *H10D 62/299* (2025.01)

(58) Field of Classification Search
CPC ........... H01L 29/66492; H01L 29/7833; H01L 29/0653; H10D 62/116; H10D 30/022; H10D 30/0227; H10D 30/0281; H10D 30/601; H10D 30/603; H10D 30/65; H10D 62/299
See application file for complete search history.

(56) References Cited

U.S. PATENT DOCUMENTS 8,796,666 B1 8/2014 Huang et al.
8,822,243 B2 9/2014 Yan et al.
(Continued)

FOREIGN PATENT DOCUMENTS

CN 107230660 A 10/2017

OTHER PUBLICATIONS

Korea Sensor Lab, "Evaluation/Analysis of Low frequency noise," http:/ksensor.co.kr/english/content/business/business_02htm (last accessed Mar. 19, 2018).

*Primary Examiner* — Ratisha Mehta
(74) *Attorney, Agent, or Firm* — HAYNES AND BOONE, LLP

(57) ABSTRACT

In an embodiment, an integrated circuit (IC) device comprises a semiconductor substrate, an isolation region and an active region disposed on the semiconductor substrate, a gate stack disposed over the active region, and a source and a drain disposed in the active region and interposed by the gate stack in a first direction. The active region is at least partially surrounded by the isolation region. A middle portion of the active region laterally extends beyond the gate stack in a second direction that is perpendicular to the first direction.

20 Claims, 12 Drawing Sheets

Related U.S. Application Data division of application No. 15/940,617, filed on Mar. 29, 2018, now Pat. No. 10,868,116.

(60) Provisional application No. 62/593,049, filed on Nov. 30, 2017.

(51) Int. Cl.
  *H10D 30/60* (2025.01)
  *H10D 30/65* (2025.01)
  *H10D 62/17* (2025.01)

(56) References Cited

U.S. PATENT DOCUMENTS

| | | |
|---|---|---|
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,876,114 B2 | 1/2018 | Huang |
| 2009/0104742 A1 | 4/2009 | Pas |
| 2010/0237439 A1 | 9/2010 | Lee et al. |
| 2012/0001271 A1* | 1/2012 | Chae ............ H10D 64/518 257/E27.06 |
| 2012/0007179 A1 | 1/2012 | Pang |
| 2015/0171809 A1* | 6/2015 | Song ............ H10D 84/0135 257/288 |
| 2015/0295055 A1* | 10/2015 | Chu ............ H10D 62/126 257/288 |
| 2017/0194425 A1* | 7/2017 | Lee ............ H01L 21/28123 |
| 2017/0278748 A1 | 9/2017 | Farmer et al. |

\* cited by examiner

CIRCUIT STRUCTURE AND METHOD FOR REDUCING ELECTRONIC NOISES

This is a continuation application of U.S. patent application Ser. No. 17/121,062, filed Dec. 14, 2020, which is a divisional application of and claims priority to U.S. application Ser. No. 15/940,617, filed Mar. 29, 2018, which is a non-provisional application of and claims priority to U.S. Provisional Patent Application No. 62/593,049, entitled "Circuit Structure and Method for Reducing Noises" and filed Nov. 30, 2017, the entire disclosure of which is hereby incorporated by reference.

BACKGROUND

An integrated circuit (IC) includes various devices (e.g., transistors, diodes, and resistors) connected together and configured to work as a functional circuit. In existing field effect transistors (FETs), different materials come into contact in a channel, creating various interface areas. For example, a channel has a horizontal interface with an overlaying gate dielectric layer and vertical interfaces with isolation features that extend into the channel from the sides. During field application, charge carriers (electrons or holes) travelling in the channel between a source and a drain are affected by such interfaces as the charge carriers get trapped and detrapped at the interfaces. The fluctuation in carrier mobility tends to generate or increase electronic noises, such as flicker noise and random telegraph signal (RTS) noise. Flicker noise (sometimes called 1/f noise or pink noise) is a low frequency noise that may exhibit an inverse frequency power density curve. RTS noise (sometimes called burst noise, popcorn noise, impulse noise, bi-stable noise) may cause sudden changes in channel current at random and unpredictable times. Although certain measures such as thinning down the gate dielectric thickness may reduce noises, a thinner gate dielectric layer may degrade performance of a transistor, for example, in high-voltage applications. Thus, a new device structure is desired to address the above concerns in high-voltage and other transistor applications.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
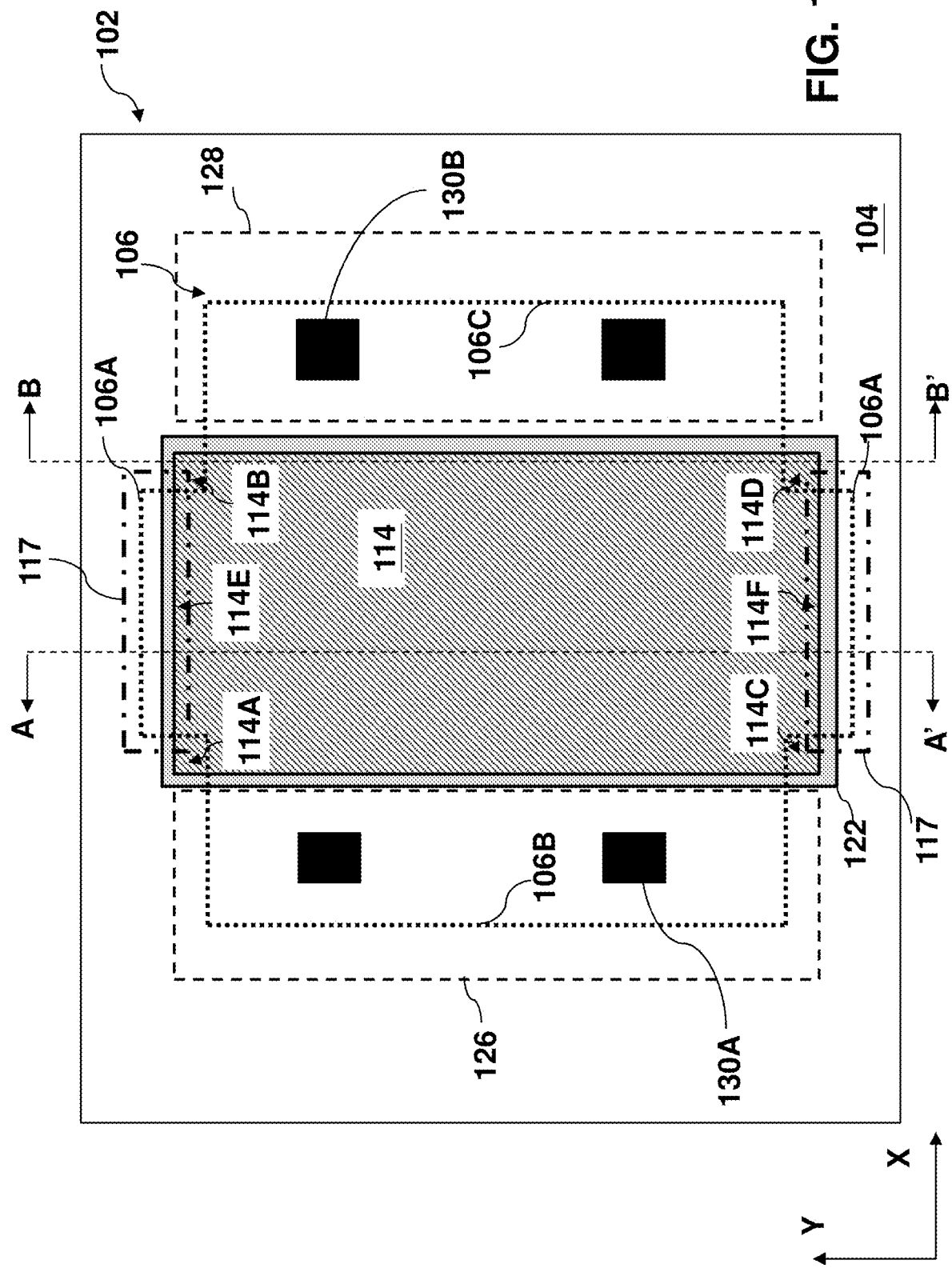
FIG. 1A is a top view of a semiconductor device structure according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is to be understood that the following disclosure provides many different embodiments, or examples, for implementing different features of various embodiments. Specific examples of components and arrangements are described below to simplify the present disclosure. These are, of course, merely examples and are not intended to be limiting.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1B:
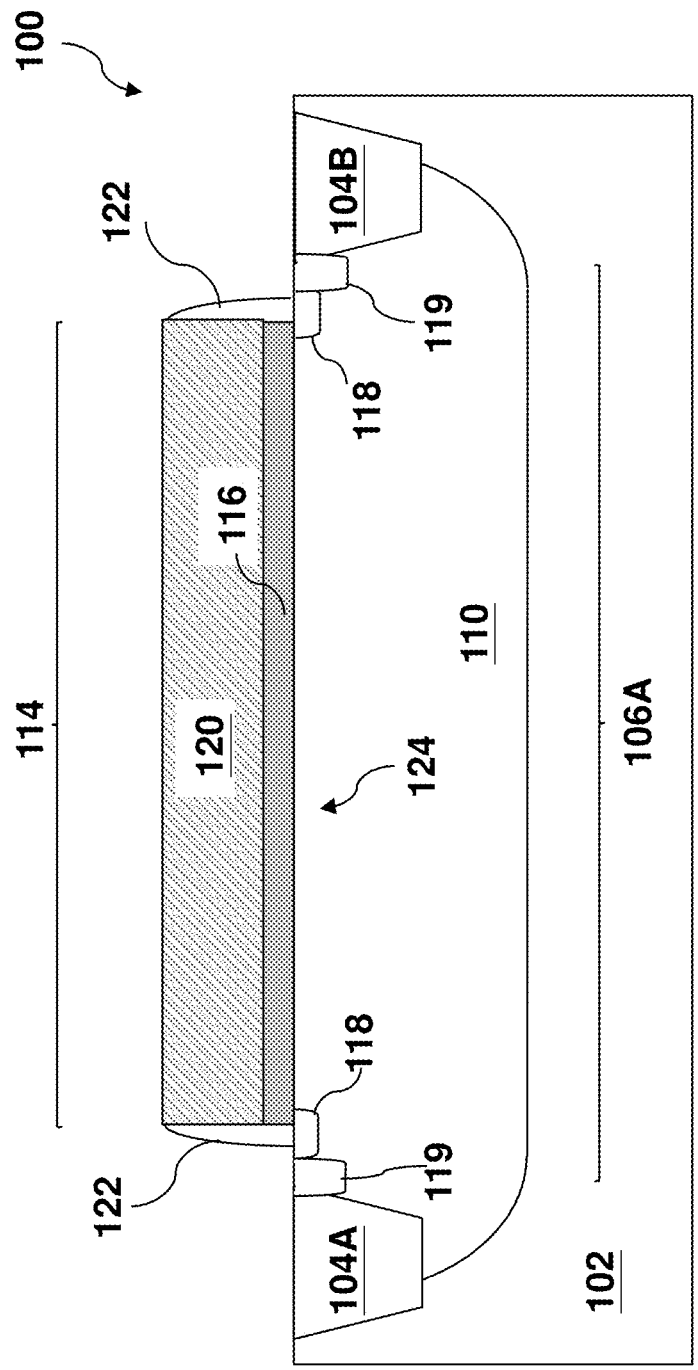
FIGS. 1B and 1C are sectional views of the semiconductor structure of FIG. 1A along the dashed lines AA' and BB', respectively, according to various embodiments.
Figure 1C:
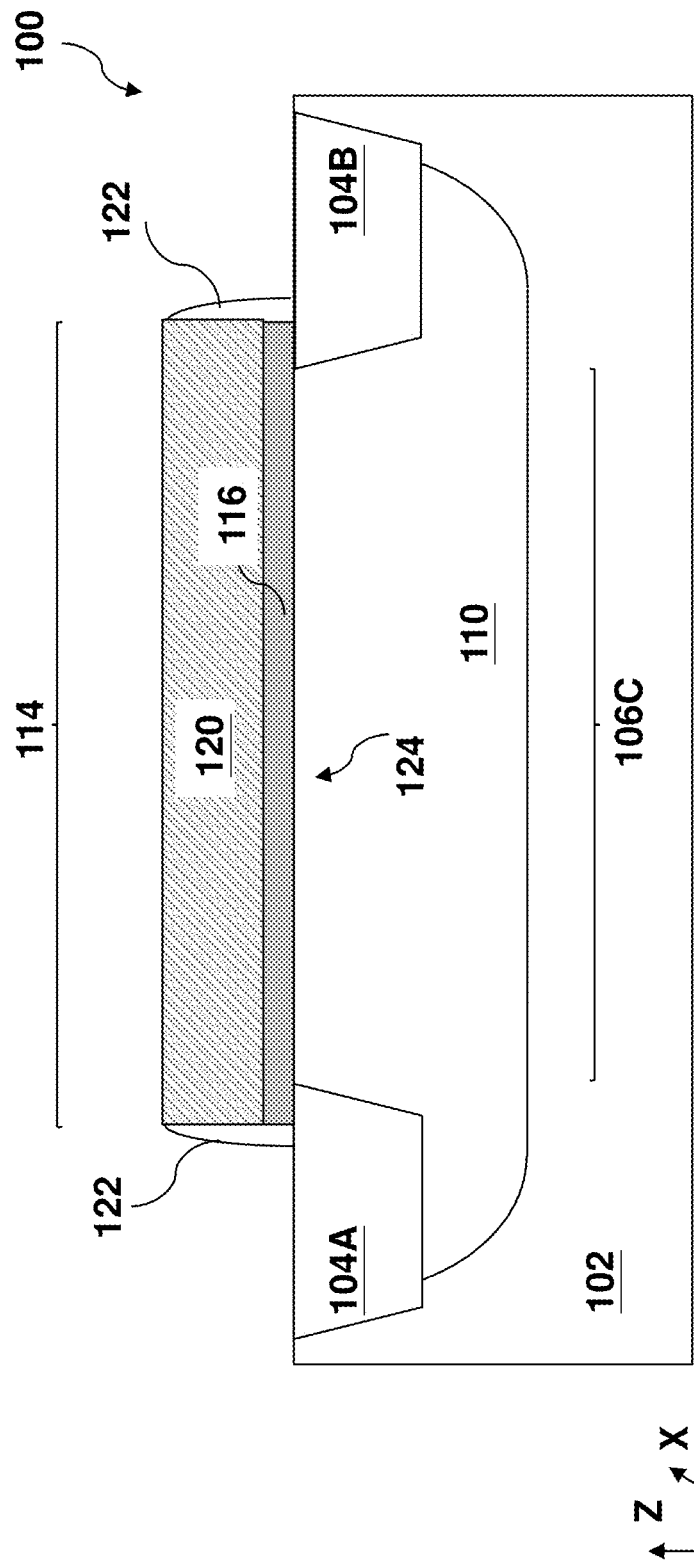

FIG. 1A is a schematic top view of a semiconductor structure (or device, or work piece) 100 constructed according to various aspects of the present disclosure in one embodiment. FIG. 1B is a schematic sectional view of the semiconductor structure 100 along the dashed line AA', and FIG. 1C is a schematic sectional view of the semiconductor structure 100 along the dashed line BB'. In some embodiments, the semiconductor structure 100 is formed on fin active regions and includes fin field-effect transistors (Fin-FETs). In some embodiments, the semiconductor structure 100 is formed on flat active regions and includes a plain field-effect transistor (FET). The FET may be n-type (nFET) or p-type (pFET).

The semiconductor structure 100 is part of an integrated circuit (IC) device, and it includes a substrate 102. The substrate 102 may be a bulk silicon substrate. Alternatively, the substrate 102 may include an elementary semiconductor (e.g., silicon or germanium in a crystalline structure), a compound semiconductor (e.g., silicon germanium, silicon carbide, gallium arsenic, gallium phosphide, indium phosphide, indium arsenide, and/or indium antimonide), or combinations thereof. The substrate 102 may also include a silicon-on-insulator (SOI) substrate, which is fabricated using separation by implantation of oxygen (SIMOX), wafer bonding, and/or other suitable methods.

The substrate 102 includes one or more isolation regions such as isolation region 104 formed on the substrate 102. The isolation region 104 at least partially surrounds and defines various active regions, such as active region 106, on the substrate 102. The isolation region 104 utilizes isolation technology, such as local oxidation of silicon (LOCOS) and/or shallow trench isolation (STI), to electrically isolate the various active regions. In some embodiments, different parts of the isolation region 104 are referred to as isolation features (e.g., isolation features 104A and 104B shown in FIGS. 1B and 1C). The isolation region 104 includes silicon oxide, silicon nitride, silicon oxynitride, other suitable dielectric materials, or combinations thereof. The isolation region 104 is formed by any suitable process. For example, forming STI features includes using a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as chemical mechanical polishing (CMP). In some examples, the filled trench may have a multi-layer structure, such as a thermal oxide liner layer filled with silicon nitride or silicon oxide.

Active regions (such as 106) are those regions with semiconductor surface where various doped features are formed and configured as components of one or more devices, such as a diode, a transistor, and/or other suitable devices. The active region 106 may include a semiconductor material similar to that of the bulk semiconductor material of the substrate 102 (e.g., silicon) or a different semiconductor material, such as silicon germanium (SiGe), silicon carbide (SiC), or multiple semiconductor material layers (e.g., alternating silicon and silicon germanium layers) formed on the substrate 102 by epitaxial growth, for performance enhancement, such as strain effect to increase carrier mobility. The isolation region 104 separates the active region 106 from other active regions (not shown in FIGS. 1A-1C). In some embodiments, the active region 106 is three dimensional, such as a fin active region extending above the substrate 102. The fin active region may be formed by selective etching to recessing the isolation region 104, or by selective epitaxial growth with a semiconductor that is the same or different from that of the substrate 102, or a combination both methods.

The semiconductor substrate 102 includes various doped features—such as n-type doped wells, p-type doped wells, source and drain, other doped features, or combinations thereof—configured to form various device components or structures. For instance, the semiconductor substrate 102 includes a doped well 110 of a first-type. In an nFET, the doped well 110 is a p-well (i.e., doped with a p-type dopant). The dopant (such as boron) in the doped well 110 may be introduced to the substrate 102 by ion implantation or other suitable technique. The doped well 110 may be formed by a procedure that includes first forming a patterned mask with an opening on the substrate 102, where the opening defines the region for the doped well 110; and then performing an ion implantation to introduce the dopant into the substrate 102 using the patterned mask as an implantation mask. The patterned mask may be a patterned resist layer formed by lithography or a pattern hard mask formed by lithography process and etching. In the present embodiment, the doped well 110 encloses the active region 106 in the top view, as illustrated in FIG. 1A, so as to ensure full doping of the active region 106 with the first type dopant.

The semiconductor structure 100 further includes a gate stack 114 having a length oriented in the X direction and a width oriented in the Y direction. Note that the Y direction is orthogonal to the X direction, and the X and Y directions define the top surface of the substrate 102. The top surface has a normal direction along the Z direction, which is orthogonal to both X and Y directions. In some embodiments, the gate stack 114 covers part of the active region 106 but does not extend to any other active region. As shown in the top view in FIG. 1A, the four corners of the gate stack 114 extends beyond the active region 106 into the isolation region 104.

As shown in FIGS. 1B and 1C, the gate stack 114 includes a gate dielectric layer 116 and a gate electrode 120 disposed thereon. The gate dielectric layer 116 includes a dielectric material such as silicon oxide or a high-k material such as metal oxide, metal nitride or metal oxynitride. In various examples, the high-k dielectric material includes metal oxide such as $ZrO_2$, $Al_2O_3$, and $HfO_2$—formed by a suitable method, such as metal organic chemical vapor deposition (MOCVD), physical vapor deposition (PVD), atomic layer deposition (ALD), or molecular beam epitaxy (MBE). The gate dielectric layer 116 may further include an interfacial layer interposed between the semiconductor substrate 102 and the high-k dielectric material. In some embodiments, the interfacial layer includes silicon oxide formed by ALD, thermal oxidation, or ultraviolet-ozone oxidation. A thickness of the gate dielectric layer 116 can be tuned to optimize device performance. For example, high-voltage applications may require a relatively thick gate dielectric layer 116, but the thickness may increase noises. Thus, as described in details below, other aspects of the gate stack 114 are designed to minimize noise issues while maintaining the viability of semiconductor structure 100 for high-voltage applications.

The gate electrode 120 includes metal, such as aluminum, copper, tungsten, metal silicide, metal alloy, doped polysilicon, other proper conductive material or a combination thereof. The gate electrode 120 may include multiple conductive films designed such as a capping layer, a work function metal layer, a blocking layer and a filling metal layer (such as aluminum or tungsten). The multiple conductive films are designed for work function matching to nFET (or pFET). In some embodiments, the gate electrode 120 for nFET includes a work function metal with a composition designed with a work function equal 4.2 electronic volts (eV) or less. In other cases the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other examples, the work function metal layer for pFET includes titanium nitride, tantalum nitride or a combination thereof.

The gate stack 114 may be formed by various deposition techniques following a proper procedure, such as a gate-last process, wherein a dummy gate is first formed and is then replaced by a metal gate after forming source and drain. Alternatively, the gate stack 114 may be formed by high-k-last process, where both the gate dielectric material layer 116 and the gate electrode 120 are replaced by a high-k dielectric material and metal, respectively, after forming source and drain. The gate stack 114 may further include on its sidewalls a gate spacer 122. In some embodiments, the gate spacer 122 is considered as attached to the gate stack 114 and separating the gate stack 114 from other structures such as the isolation region 104. The spacer 122 includes silicon oxide, silicon nitride, silicon oxynitride, other suitable dielectric material, or a combination thereof. The spacer 122 may have a multilayer structure and may be formed by depositing dielectric material and then anisotropic etching, such as plasma etching. One exemplary gate stack 114 and the method of making the same are further described below in accordance with some embodiments.

The semiconductor structure 100 includes a channel region 124 defined on the active region 106 and underlying the gate stack 114. The channel region 124 may be tuned for proper threshold voltage or other parameters by ion implantation. The channel region 124 has a same type of dopant to that of the doped well 110 but at a greater concentration, depending on the application and device specification. In the present example for nFET, the channel region 124 is doped with a p-type dopant.

The semiconductor structure 100 further includes a source 126 and a drain 128 formed on the active region 106 on opposite sides of the gate stack 114. An N-type doped region functions as the source 126 (or source feature) and another N-type doped region functions as the drain 128 (or drain feature). The source 126 and the drain 128 are doped with an N-type impurity such as phosphorous for an nFET. The source 126 and the drain 128 may be formed by ion implantation and/or diffusion. Other processing steps may be further included to form the source 126 and the drain 128. For example, a rapid thermal annealing (RTA) process may be used to activate the implanted dopant. The source 126 and the drain 128 may have different doping profiles formed by multi-step implantation. For example, additional doping features such as light doped drain or double diffused drain may be included. Also, the source 126 and the drain 128 may have different structures, such as raised, recessed, or strained. For example, if the active region 106 is a fin active region, the formation of the source 126 and the drain 128 may include: an etching process to recess source and drain regions; an epitaxial growth process to form epitaxial source and drain with in-situ doping; and an annealing process for activation. The channel region 124 is interposed between the source 126 and the drain 128.

Although FIGS. 1A-1C illustrate the source 126 and the drain 128 as somewhat symmetrically disposed on both sides of the channel region 124, in some embodiments the source 126 and the drain 128 are configured asymmetrically (e.g., for some high voltage applications). The drain 128, as a high voltage is applied during the field applications, may be spaced further away from the gate stack 114, thus the high voltage is able to be distributed in the region between the gate and the drain 128 to reduce high voltage damages to the device. The source 126 may be configured closer to the gate stack 114, such that an edge of the source 126 is aligned to an edge of the gate stack 114, as illustrated in FIG. 1A. The formation of the source 126 and the drain 128 may include forming a patterned mask to define source and drain regions, and implantation or epitaxial growth to form the source 126 and the drain 128. The source 126 may further include silicide on its top surface to reduce contact resistance. For example, silicide on the source 126 may be formed by a self-aligned silicide procedure that further includes depositing a metal (such as nickel, cobalt, titanium or other suitable metal) on the source; annealing to react the metal with silicon of the source 126 to form metal silicide; and etching to remove unreacted metal.

In some embodiments, the source 126 and the drain 128 are epitaxially grown. The epitaxial source and drain may be formed by selective epitaxial growth for straining effect with enhanced carrier mobility and device performance. The source 126 and the drain 128 are formed by one or more epitaxial growth process, where silicon (Si) features, silicon germanium (SiGe) features, silicon carbide (SiC) features, and/or other suitable semiconductor features are grown in a crystalline state on the active region 106 within source and drain regions (such as defined by a patterned hard mask). In an alternative embodiment, an etching process is applied to recess portions of the active region 106 within the source and drain regions before the epitaxial growth process. The etching process may also remove any dielectric material disposed on the source/drain regions, such as during the formation of the gate sidewall features. Suitable epitaxy processes include CVD deposition techniques (e.g., vapor-phase epitaxy (VPE) and/or ultra-high vacuum CVD (UHV-CVD), molecular beam epitaxy, and/or other suitable processes. The source 126 and the drain 128 may be doped in-situ during the epitaxy process by introducing doping species including: n-type dopants such as phosphorus or arsenic, or p-type dopants, such as boron or $BF_2$ for pFET. If the source 126 and the drain 128 are not doped in-situ, an implantation process (i.e., a junction implant process) is performed to introduce the corresponding dopant into the source 126 and the drain 128. In some other embodiments, the raised source and drain are formed by epitaxial growth with more than one semiconductor material layers. For example, a silicon germanium layer is epitaxially grown on the substrate 102 within the source and drain regions and a silicon layer is then epitaxially grown on the silicon germanium layer.

The semiconductor structure 100 further includes contact features, such as contact pads 130A and 130B, formed on various doped regions. As an example illustrated in FIG. 1A, two contact pads 130A are formed on the source 126, and two contact pads 130B are formed on the drain 128. The source 126 and the drain 128 may use any suitable number of contact features or pads. Contact pad(s) for the gate stack 114 may be routed to the gate stack 114 via other structures or may be directly disposed on the gate stack 114 (e.g., when there is insufficient room to form its contact pads outside of the gate stack 114). The semiconductor structure 100 functions as a FET (an nFET in the present example). For example, the source 126, the drain 128, the channel region 124, and the gate stack 114 constitute the nFET.

In conventional FETs, a channel has significant vertical interface areas with isolation features that extend into the channel from the sides. That is because the entire width of a gate stack in the Y direction laterally extends well into the isolation features. As a result, during field application, charge carriers (electrons or holes) travelling in the channel get trapped and detrapped at the interface areas. The fluctuation in carrier mobility tends to generate or increase electronic noises, such as flicker noise and random telegraph signal (RTS) noise. In the present disclosure, one or more of the active region 106, the isolation region 104, and the gate stack 114 is modified to reduce or eliminate such noises by reducing the amount of lateral overlap between the gate stack 114 and the isolation region 104. In other words, an edge of the isolation region 104 is moved further away from the channel region 124 by reducing an overlapping area between the isolation region 104 and the overlaying gate stack 114.

As shown in FIG. 1A, the active region 106 may be divided into three rectangular portions arranged in the X direction: a middle portion 106A, a left portion 106B, and a right portion 106C, where the middle portion 106A is sandwiched by the left portion 106B and the right portion 106C. The middle portion 106A is wider in the Y direction than the left portion 106B and the right portion 106C. Therefore, from the perspective of a top view such as FIG. 1A, the middle portion 106A laterally extends beyond the gate stack 114 in the Y direction. But the four corner portions of the gate stack 114—namely, corner portions 114A, 114B, 114C, and 114D—still laterally extend beyond the active region 106 into the isolation region 104. The reason that the corner portions 114A-114D reach into the isolation region 104 is to prevent any leakage current from circumventing the gate stack 114 between the source 126 and the drain 128. In other words, if the entire gate stack 114 stays laterally within the active region 106 with extra active space, the gate stack 114 may no longer effectively control the channel region 124 since a leakage current may flow between the source and drain outside the gate stack 114. Two edge portions of the gate stack 114—namely, edge portion 114E sandwiched between corner portions 114A and 114B, and edge portion 114F sandwiched between corner portions 114C and 114D—do not laterally extend into the isolation region 104. From the top view perspective, edges of the active region 106 laterally "intersect" edges of the gate stack 114 (although they have different vertical positions as shown in FIGS. 1B and 1C).

In some embodiments, one or more doping features 117 may be formed at edges of the middle portion 106A in order to further reduce operational noises. Each doping feature 117 uses the same dopant type with the channel region 124 but has a higher (e.g., 20 times higher) doping concentration. The higher doping concentration changes the interfacial dynamics between the channel region 124 and the edge of the isolation region 104, thereby effectively reducing the impact of the isolation region 104 on current conduction in the channel region 124. Such a configuration reduces noises generated by an interface area between the edge of the isolation region 104 and an upper portion of the channel region 124 where most current conduction occurs.

In some embodiments, each doping feature 117 may include multiple features with varying doping concentrations. For example, as shown in FIG. 1B, each doping feature 117 includes a low density doped (LDD) feature 118 and a high density doped (HDD) feature 119. In an nFET, the LDD and HDD features may be called NLDD and NHDD features, respectively. In a pFET, the LDD and HDD features may be called PLDD and PHDD features, respectively. In some embodiments, the LDD feature 118 has a doping concentration at least twice as high as that of a channel region 124 underneath the gate stack 114. The HDD feature 119 includes a doping concentration that is at least 10 times as high as that of the LDD feature 118. The LDD feature 118 is disposed underneath the spacer 122 to separate an edge portion (114E or 114F) of the gate stack 114 from the isolation region 106. The HDD feature 119 is disposed to further separate the LDD feature 118 and the spacer 122 from the isolation region 104. In some embodiments, the LDD feature 118 is relatively shallower than the HDD feature 119. Together, the LDD feature 118 and the HDD feature 119 effectively block an edge of the isolation region 104 from affecting current conduction in the upper portion of the channel region 124.

Figure 1D:
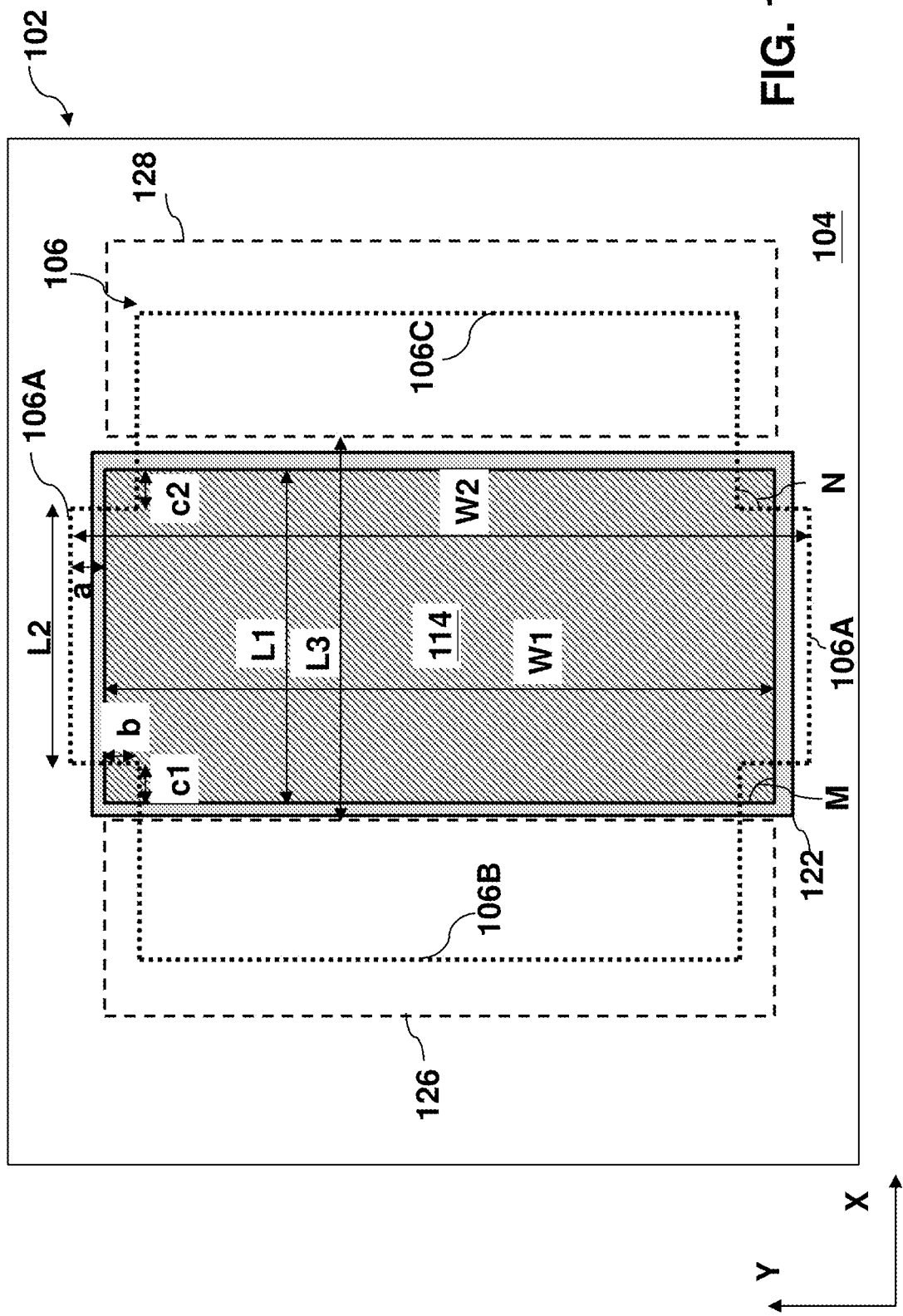
FIG. 1D is a further top view of the semiconductor device structure according to various embodiments.

FIG. 1D is a simplified version of FIG. 1A with additional dimensional notations. Assume the gate stack 114 has a length L1 in the X direction and a width W1 in the Y direction (not accounting thickness of the spacer 122). Assume the middle portion of the active region 106A has a length L2 in the X direction and a width W2 in the Y direction. Assume the corner portions 114A and 114B have lengths c1 and c2, respectively, in the X direction. As shown in FIG. 1D, L1 is greater than L2 (L1=L2+c1+c2) and L1 is smaller than W2. In order to minimize the overlapping area between the isolation region 104 and the gate stack 114 while preserving keeping the four corner portions 114A-114D laterally in the isolation region 104, L2 may be as close to L1 as practicable. In some embodiments, L2 is no less than 95% of L1. In other words, the total length of the corner portions 114A and 114B (c1+c2) only accounts for no more than 5% of the gate stack length (L2). In alternative embodiments, however, L2 may be much shorter than L1 (e.g., between 5%-50% of L1).

As shown in FIG. 1D, the middle portion 106A laterally extends beyond the gate stack 114 by a first distance (a) in the Y direction, and the four corner portions 114A-114D laterally extend beyond the left and right portions 106B and 106C by a second distance (b) in the Y direction. In some embodiments, the first distance and the second distance are about equal (i.e., a=b). In other words, an edge of the gate stack 114 running in the X direction is disposed at about the mid-point in the Y direction between an edge of the middle portion 106a and edges of the left and right portions 106B and 106C.

The source 126 and the drain 128 are separated by the channel region 124 with a channel width in the Y direction (which may be roughly the same with W1) and a channel length in the X direction (L3, which may be different from L1 when the source 126 or the drain 128 is not aligned with edges of the gate stack 114). Therefore, the channel width in the Y direction may be less than W2 (i.e., the middle portion 106A laterally protrudes or sticks out of the channel region 124).

Although the active region 106 and the gate stack 114 are illustrated herein as having regular shapes with straight edges, other suitable shapes with polygonal or curve lines are contemplated by the present disclosure. For example, the corner portions 114A-114D may have rounded or straight corners. FIG. 1D shows that the corner portions 114A-114D have a normal angle of 90 degrees (denoted as angle "M"), but this angle may have another value. The active region 106 may or may not have a normal angle (denoted as angle "N") at the juncture between its middle portion 106A and left and right portions 106B or 106C. Depending on the shape of the active region 106 and the gate stack 114, methods of measuring the various dimensions disclosed herein may vary accordingly.

The various FET structures disclosed herein may have any suitable size or dimension. In some embodiments, when used for analog and radio frequency (RF) applications an FET may have relatively large sizes (e.g., at least hundreds of nanometers in width or length). For example, a, b, c1, and c2 shown in FIG. 1D may each be in the range of 0.03 to 0.3 micrometer (um). Depending on the design, each of a, b, c1, and c2 may be the same or may be different from one another. In some embodiments, L2 is 0.3 um or more (e.g., 0.3-1 um).

Figure 2:
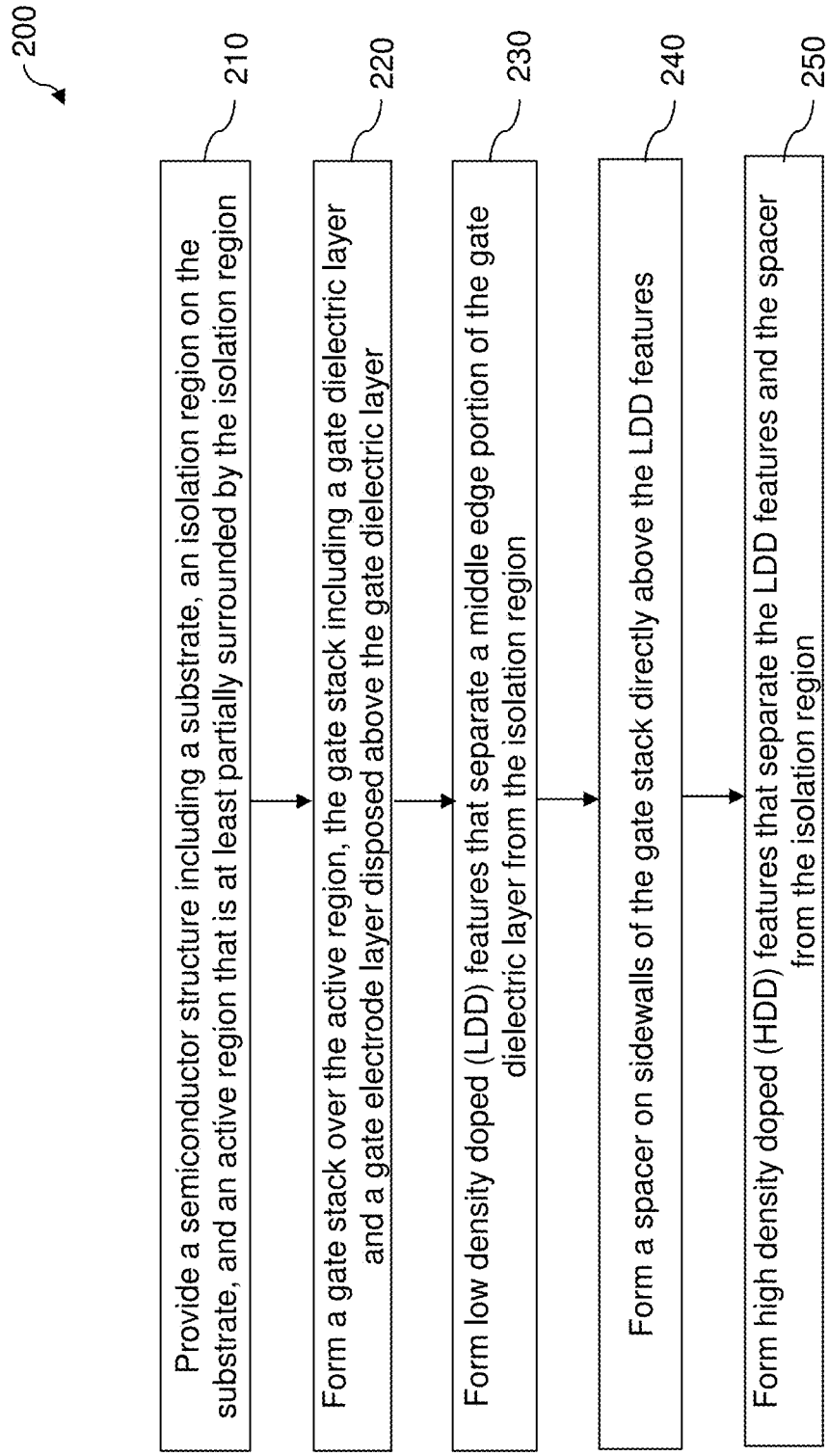
FIG. 2 is a flowchart of a method making a semiconductor structure according to various embodiments.
Figure 3A:
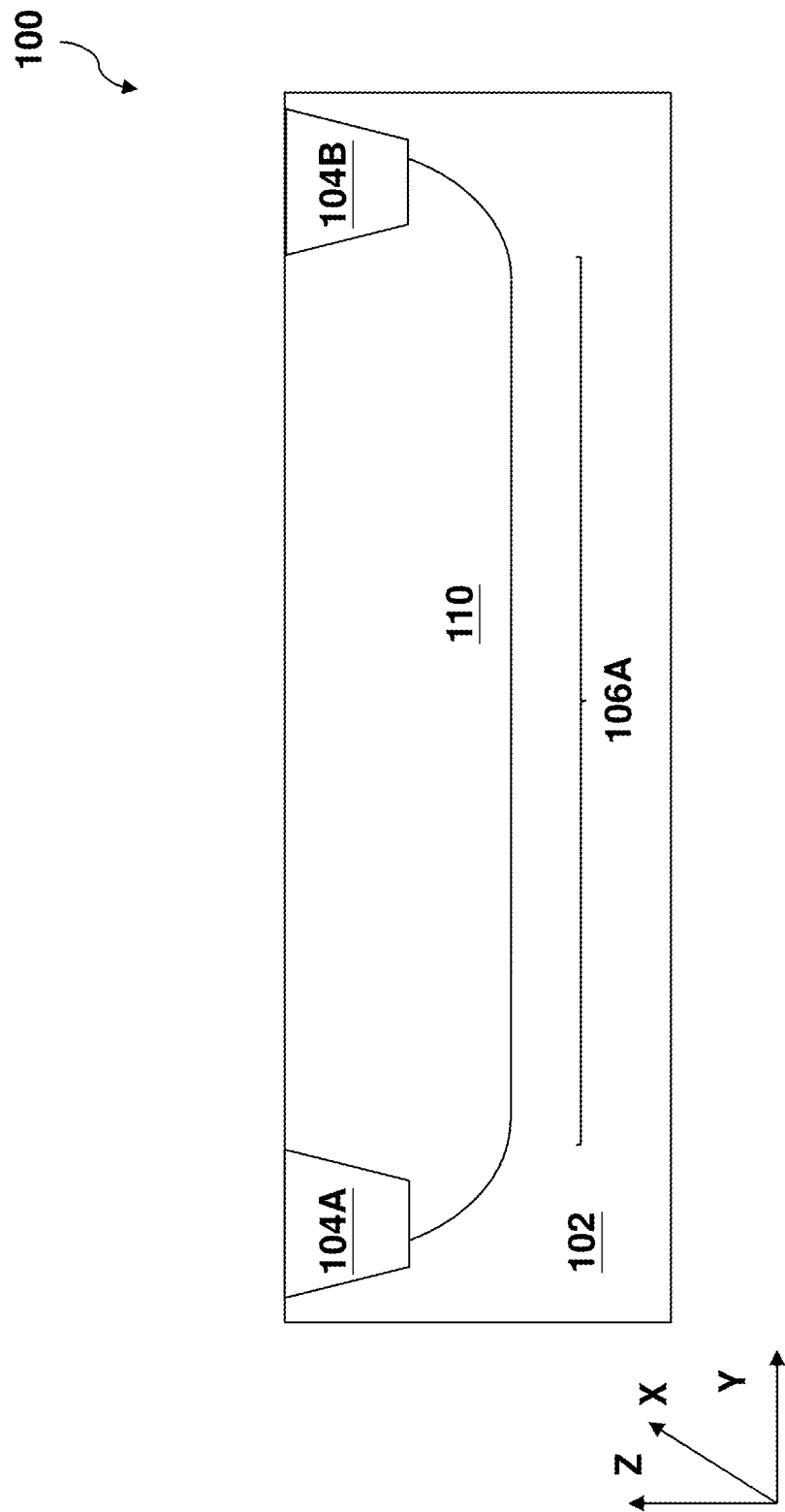
FIGS. 3A, 3B, 3C, 3D, and 3E are sectional views of a semiconductor structure during various intermediate stages of fabrication, according to various embodiments.

FIG. 2 is a flowchart of the method 200 for making an IC device having an FET. The method 200 is described in connection with FIGS. 3A-3E, which are the same sectional view as FIG. 1B but represent intermediate stages of the semiconductor structure 100 before leading to the semiconductor structure 100 shown in FIG. 1B. In operation 210, a starting semiconductor structure is provided, which includes the substrate 102, the isolation features 104A and 104B on the substrate 102, and the active region 106, as shown in FIG. 3A. The isolation features 104A and 104B at least partially surround and define the active region 106. The formation of the isolation features 104A and 104B may include forming a patterned mask by lithography; etching the substrate 102 through the openings of the patterned mask to form trenches; filling the trench with one or more dielectric material; and performing a CMP process. In some embodiments, the active region 106 may be three-dimensional, such as fin active regions. In this case, the operation 202 may further includes selective etching to recess the isolation features 104A and 104B or selective epitaxial growth to the active regions with one or more semiconductor material.

Figure 3B:
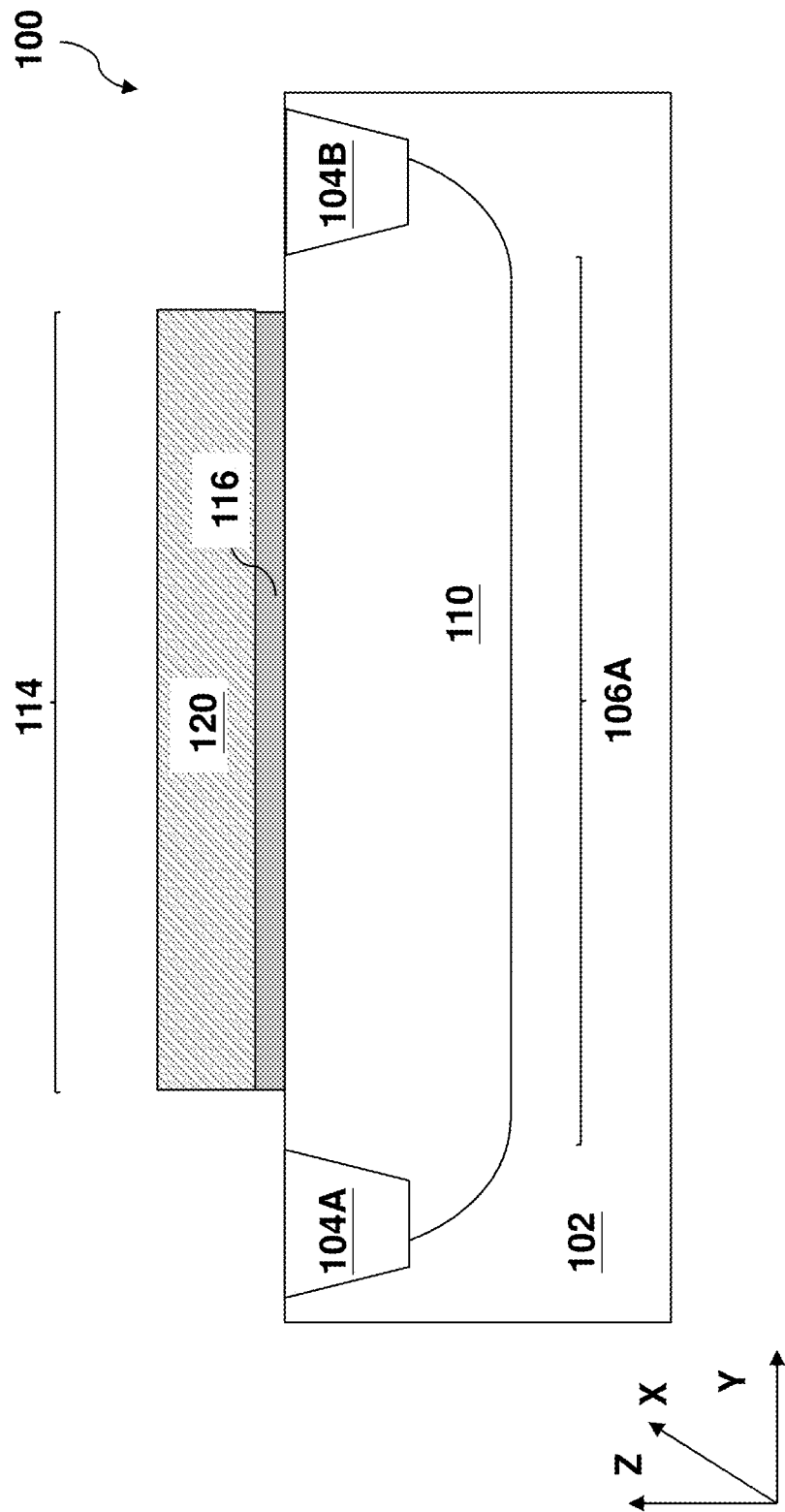

In operation 220, the gate stack 114 is formed over the active region 106. As shown in FIG. 3B, the gate stack 114 at this stage includes the gate dielectric layer 116 and the gate electrode layer 120 formed above the gate dielectric layer 116. The gate dielectric layer 116 may include silicon oxide, high-k dielectric material, other suitable dielectric material, or a combination thereof. The gate electrode 120 includes any suitable conductive material, such as doped poly-silicon, metal, metal alloy, or metal silicide. The formation of the gate stack 114 may include a gate-last process, a high-k-last process, or other suitable procedure.

Figure 3C:
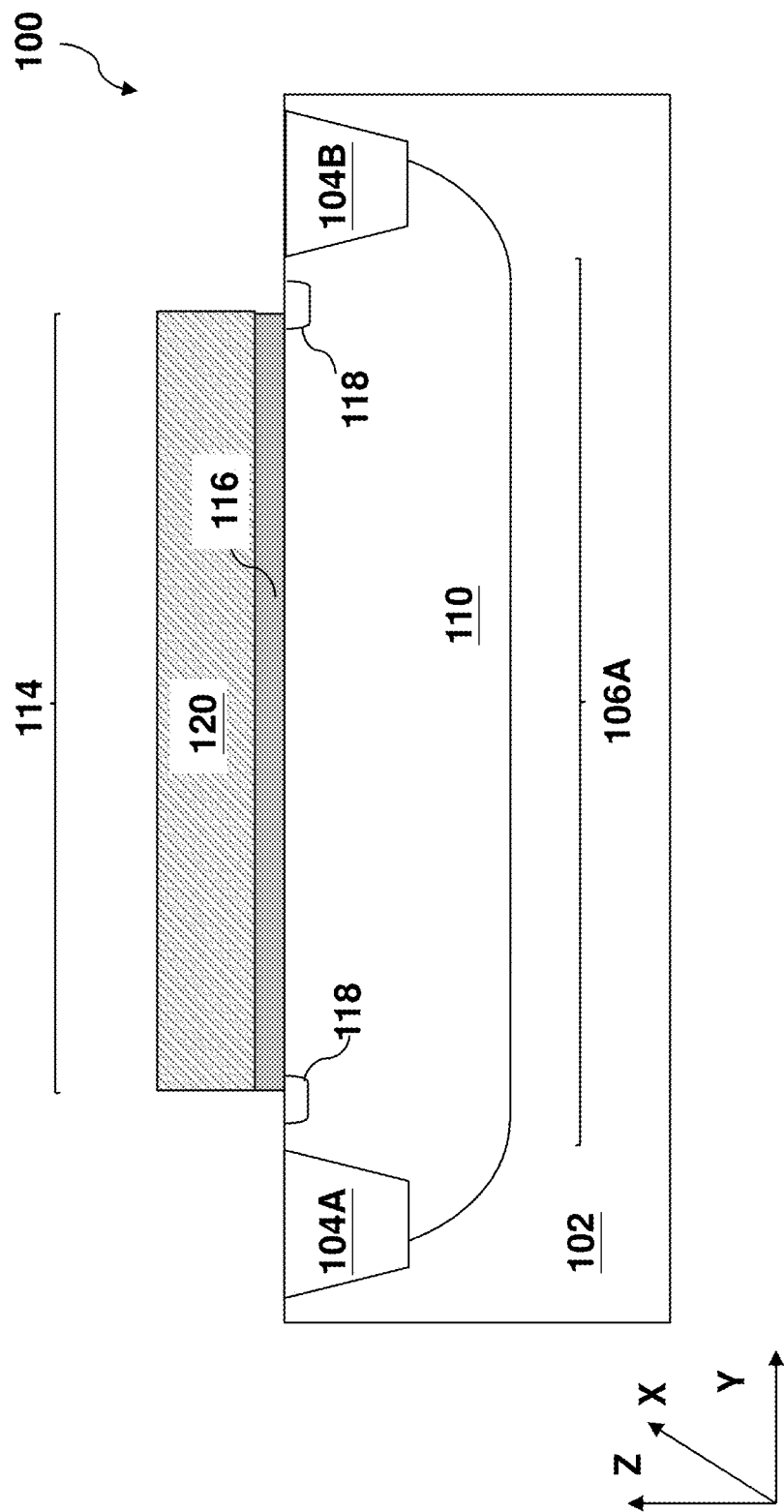

In operation 230, two LDD features 118 are formed in the middle portion 106A of the active region 106, as shown in FIG. 3C. Each LDD feature 118 is disposed at an edge portion (114E or 114F) of the gate dielectric layer 116 and separates it from the isolation features 104. Profiles of the LDD features 118 on two sides of the gate stack 114 may or may not be symmetrical. In some embodiments, only one side of the gate stack 114 has the LDD feature. The LDD feature 118 may be formed using any suitable technique, for example, by ion implantation. The LDD feature 118 has the same dopant type as the channel region 124 but has a doping concentration at least twice as high as that of the channel region 124. In some examples, the channel region 124 may have a doping concentration between $1-5*E13$ (unit is per square centimeter), while the LDD feature 118 may have a doping concentration between $6-9*E13$. In some embodiments, to ensure full doping of the LDD feature 118 with desired doping concentration in the desired region, from the top view perspective the doping area may be designed to be relatively large (since doping is shallower on the edge of the doping area).

Figure 3D:
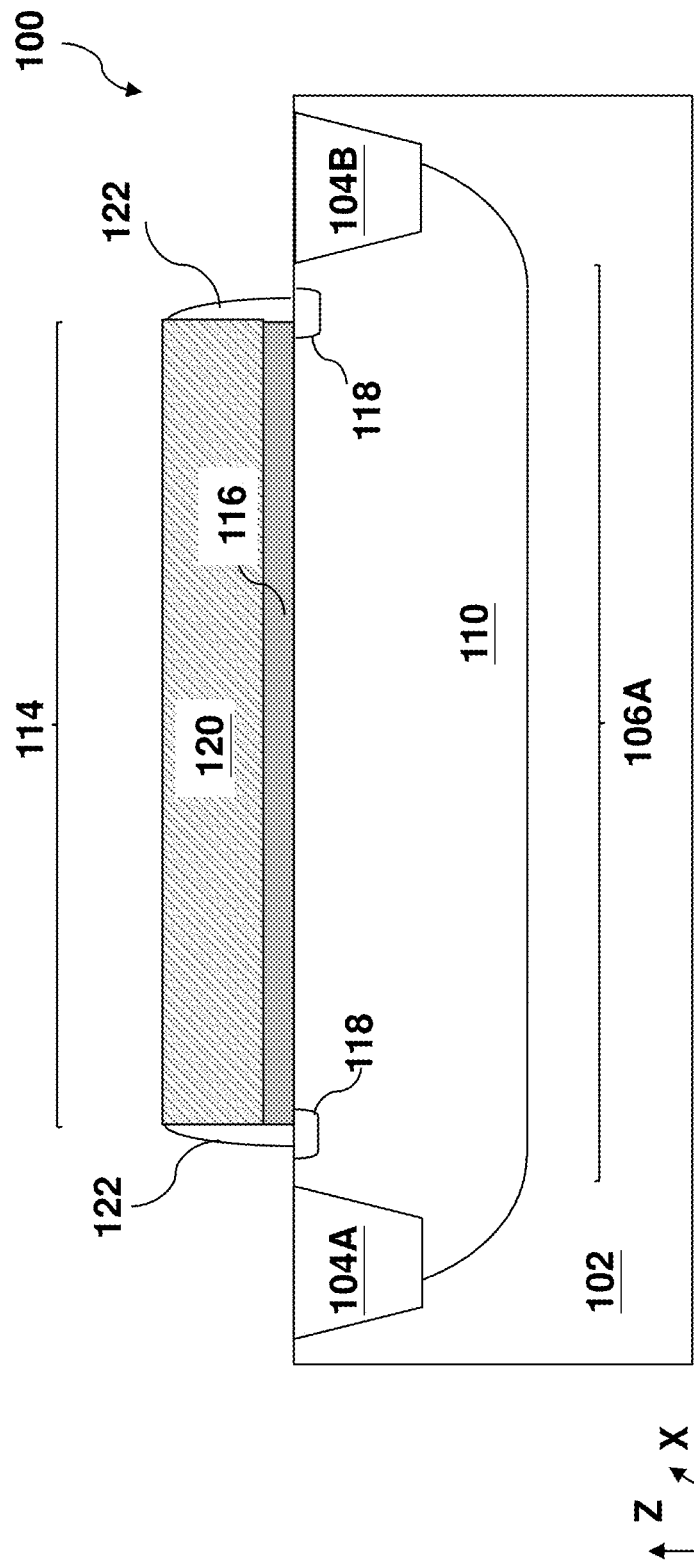

In step 240, the spacer 122 is formed on sidewalls of the gate stack directly above the LDD features 118, as shown in FIG. 3D. The spacer 122 may or may not laterally reach into the isolation features 104A and 104B depending on its thickness. In the embodiment shown in FIG. 3D, a portion of the spacer 122 is attached to a middle edge portion (114E or 114F) of the gate stack 114 that corresponds to the middle portion 106A, so this portion of the spacer 122 does not laterally extend into the isolation features 104. Alternatively, a thicker spacer 122 may laterally extend into the isolation features 104. The spacer 122 includes one or more dielectric material, such as silicon oxide or silicon nitride. Note that, although the LDD features 118 are formed before the formation of the spacer 122, in some embodiments the LDD features 118 may be formed after the formation of the spacer 122, e.g., using tilt angle implantation to extend underneath the spacer 122.

Figure 3E:
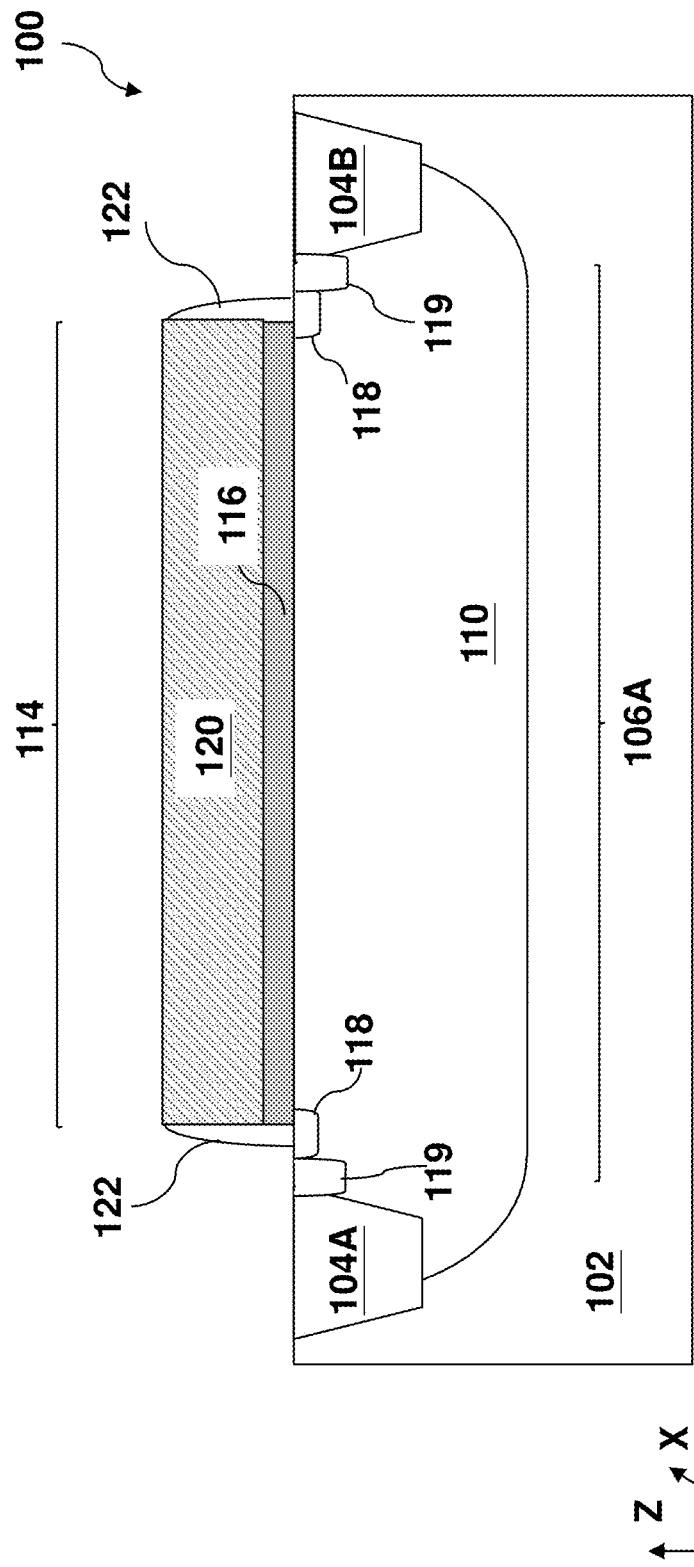

In step 250, two HDD features 119 are formed as shown in FIG. 3E. The HDD features 119 separate the LDD features 118 and the spacer 122 from the isolation features 104. Profiles of the HDD features 119 on two sides of the gate stack 114 may or may not be symmetrical. The HDD features 119 may be formed using any suitable techniques and processes. Note that the LDD features 118 and the HDD features 119 are formed using separate ion implantation processes, since the LDD features 118 are formed before forming the spacer 122, while the HDD features 119 are formed after forming the spacer 122. The HDD features 119 include a doping concentration that is at least 10 times as high as that of the LDD features 118. In some examples, the LDD feature 118 may have a doping concentration between $6-9*E13$, and the HDD feature 119 may have a doping concentration no less than $1*E15$. The dopant types for the LDD features 118 and the HDD features 119 are the same, but the doping materials may or may not be the same. Note that the channel region 124, the LDD features 118, and the HDD features 119 use the same dopant type that is opposite the dopant for the source 126 and the drain 128. In some embodiments, to ensure full doping of the HDD feature 118 with desired doping concentration in the desired region, from the top view perspective the doping area may be relatively large (since doping is shallower on the edge of the doping area), even possibly reaching into the LDD feature 118 and into the isolation region 106 (as shown in FIG. 1A and FIG. 3E). When the HDD feature 119 is doped on top of the LDD feature 118, it converts the LDD feature 118 into the HDD feature 119. Note that, due to various reasons, the doping concentration within a doping feature may not be uniform, in which case the doping concentrations disclosed herein may be measured using practicable methods.

The method 200 may additionally include other operations before, during or after the operations described above. For example, the method 200 may include an operation to form the source 126 and the drain 128 in the active region 106, where the source 126 and the drain 128 are interposed by the channel region 124 underlying the gate stack 114. The source 126 and the drain 128 may be asymmetrically configured on opposite sides of the gate stack 114 in the X direction, where the drain 128 is spaced further away from the gate stack 114 while the source 126 is aligned to the edge of the gate stack. The formation of the source 126 and the drain 128 occurs after forming the spacer 122, but may be before or after forming the HDD features 119 since they deal with different lateral regions of the semiconductor structure 100. The method 200 may continue to form other structures—such as the contact pads 130A and 130B—before forming a functional IC device.

Figure 4:
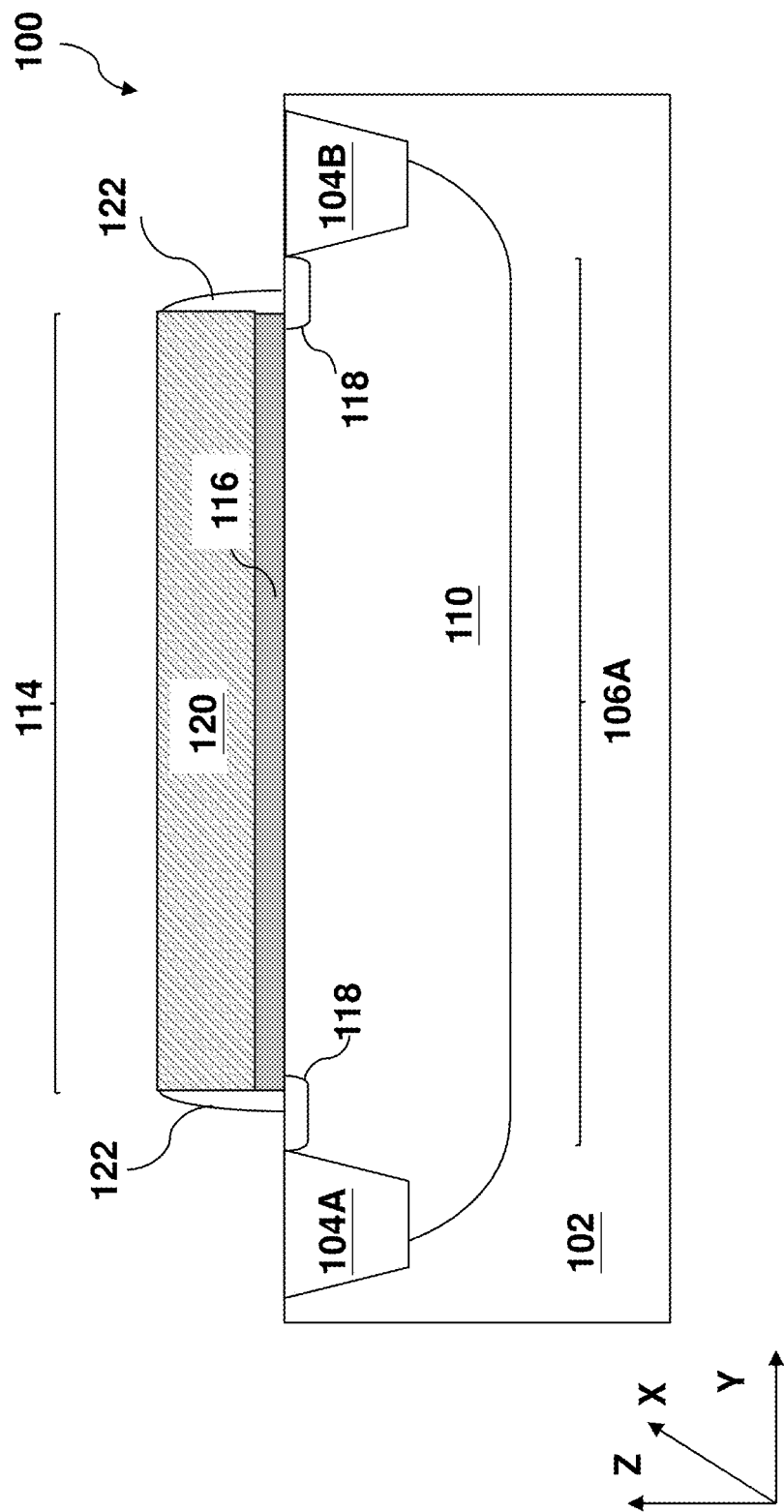
FIG. 4 is a sectional view of a semiconductor structure according to various embodiments.

FIG. 3E shows HDD features 119 formed on both sides of the gate stack 114 (in the Y direction). In an alternative embodiment as shown in FIG. 4, the LLD features 118 but not HDD features 119 are formed on both sides of the gate stack 114. In this case, the LLD features 118 may be relatively wider such that covers the entire distance between the gate stack 114 and the isolation features 104. Such a configuration effectively blocks the edges of the isolation features 104A and 104B from an upper section of the channel region 124, where most of the current conduction takes place.

Figure 5:
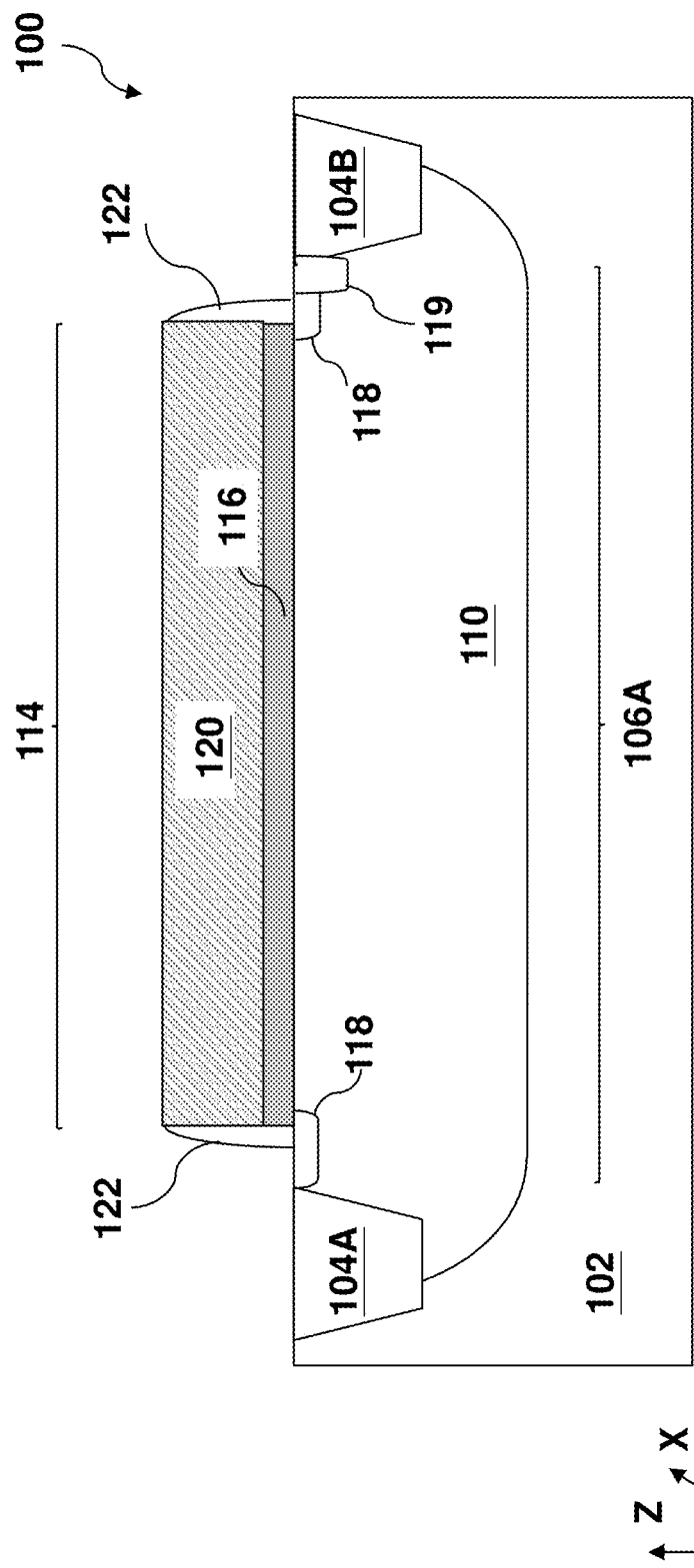
FIG. 5 is a sectional view of a semiconductor structure according to various embodiments.

In another alternative embodiment as shown in FIG. 5, the LLD features 118 are formed on both sides of the gate stack 114, but the HDD feature 119 is only formed on one side of the gate stack 114. Such an asymmetric design may be used when two sides of the gates stack 114 (in the Y direction) have different spaces available or different circuit components. In this case, one side of the gate stack 114 (where there is no HDD feature 119) has a relatively wider LDD feature 118, while the other side of the gate stack 114 (where there is the HDD feature 119) has a relatively narrower LDD feature 118.

Moving isolation features 104A and 104B away from an operating channel has various benefits. The current in the channel region 124 from the carrier (electrons in nFET or holes in pFET) is less likely to be trapped and de-trapped, which generates noises, such as RTS and flicker noise. Using a p-type dopant in an active extended region of an nFET further minimizes STI corner effect and avoids device punch-through. Further, due to the techniques used herein, the gate dielectric layer 116 may be relatively thick without causing significant noises, which are suitable for high voltage applications. The gate dielectric layer 116 may also be relatively thin, in which case stress and defect of the interface between the gate stack 114 and the channel region 124 caused by a thicker gate dielectric may be avoided.

The edge of an isolation region (e.g., an STI feature) is one of the major sources that generates RTS and flicker noises. The present disclosure provides an FET with reduced overlapping area between a channel region and an isolation region in accordance with various embodiments. By utilizing the disclosed FET structure, the edge of the isolation region is moved further away from a current-conducting channel, thereby eliminating or reducing noises such flicker and RTS noises. The transistor can be used for input/output (I/O) device, high voltage applications, radio-frequency (RF) applications, analog circuits, and other generic applications with substantially reduced noises and maintained high voltage performance. Especially, the disclosed structure and method are compatible with advanced technologies with smaller feature sizes, such as the advanced technology of 7 nm.

According to some embodiments, the present disclosure provides an IC device comprising a semiconductor substrate, an isolation region and an active region disposed on the semiconductor substrate, a gate stack disposed over the active region, and a source and a drain disposed in the active region and interposed by the gate stack in a first direction. The active region is at least partially surrounded by the isolation region. A middle portion of the active region laterally extends beyond the gate stack in a second direction that is perpendicular to the first direction. In an embodiment, the gate stack has a first length in the first direction and the middle portion of the active region has a second length in the first direction. The first length is greater than the second length such that four corner portions of the gate stack laterally extend beyond the active region into the isolation region. In an embodiment, the second length is no less than 95% of the first length. In an embodiment, the middle portion of the active region laterally extends beyond the gate stack by a first distance in the second direction and the four corner portions of the gate stack laterally extend beyond the active region by a second distance in the second direction. The first distance and the second distance are about equal. In an embodiment, the source and the drain are separated by a channel region with a channel length in the first direction and a channel width in the second direction. The channel width is less than a width of the middle portion of the active region in the second direction. In an embodiment, the IC device further comprises a spacer disposed on sidewalls of the gate stack. A portion of the spacer is attached to an edge portion of the gate stack that corresponds to the middle portion of the active region. The portion of the spacer does not laterally extend into the isolation region in the second direction. In an embodiment, the IC device further comprises a spacer portion disposed on a sidewall of the gate stack that runs along the first direction. The spacer portion laterally extends beyond the active region into the isolation region for an entire length of the sidewall. In an embodiment, the middle portion of the active region comprises an LDD feature disposed adjacent an edge portion of the gate stack. The LDD feature separates the edge portion of the gate stack from the isolation region. In an embodiment, the middle portion of the active region further comprises an HDD feature that separates the LDD feature from the isolation region. In an embodiment, the source and the drain include a first type dopant and are separated by a channel region. The channel region, the LDD feature, and the HDD feature include a second type dopant with first, second, and third doping concentrations, respectively. The second doping concentration is at least twice of the first doping concentration but is no more than a tenth of the third doping concentration.

According to other embodiments, the present disclosure provides an IC device comprising a semiconductor substrate, an isolation feature disposed on the semiconductor substrate, and a field-effect transistor disposed on the semiconductor substrate. The field-effect transistor comprises a channel region adjacent the isolation feature, a source and a drain separated by the channel region, a gate stack over the channel region, and an LDD feature disposed on the channel region and adjacent an edge portion of the gate stack, the LDD feature separating the edge portion of the gate stack from the isolation feature. In an embodiment, the edge portion of the gate stack is disposed between two corner portions of the gate stack. The LDD feature does not separate the two corner portions of the gate stack from the isolation feature. The two corner portions of the gate stack extend laterally into the isolation feature. In an embodiment, the gate stack comprises a spacer that is disposed directly above the LDD feature. In an embodiment, the source and the drain include a first type dopant, the channel region and the LDD feature include a second type dopant being opposite to the first type dopant, wherein the LDD feature has a doping concentration at least twice as high as that of the channel region. In an embodiment, the IC device further comprises an HDD feature disposed on the channel region and separating the LDD feature from the isolation feature. The HDD includes the second type dopant at a doping concentration that is at least 10 times as high as that of the LDD feature.

According to other embodiments, the present disclosure provides a method for semiconductor fabrication comprising providing a semiconductor structure including a substrate, an isolation region on the substrate, and an active region that is at least partially surrounded by the isolation region. The method further comprises forming a gate stack over the active region, the gate stack including a gate dielectric layer and a gate electrode layer disposed above the gate dielectric layer. The method further comprises forming an LDD feature that separates an edge portion of the gate dielectric layer from the isolation region, and forming a spacer on sidewalls of the gate stack directly above the LDD feature. In an embodiment, the edge portion of the gate dielectric layer is between two corner portions of the gate dielectric layer. The LDD feature does not separate the two corner portions of the gate stack from the isolation region. The two corner portions of the gate dielectric layer extend laterally into the isolation region. In an embodiment, the method further comprises forming an HDD feature that separates the LDD feature and the spacer from the isolation region. In an embodiment, the LDD feature and the HDD feature are formed on a first side of the gate stack. The method further comprises forming a second LDD feature but no additional HDD feature on a second side of the gate stack opposite to the first side of the gate stack. In an embodiment, the LDD feature and the HDD feature are formed using separate ion implantation processes. The LDD feature has a doping concentration at least twice as high as that of a channel region underneath the gate stack, and the HDD feature includes a doping concentration that is at least 10 times as high as that of the LDD feature.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   an active region over a substrate, the active region having a source region, a drain region, and a middle region between the source and drain regions along a first direction, wherein a width of the middle region is greater than a width of the source and drain regions along a second direction perpendicular to the first direction;
   an isolation region surrounding the active region; and
   a gate stack over the middle region, wherein the gate stack comprises a rectangular shape and overlaps the active region such that only four corner portions of the gate stack extending beyond the middle region are directly above the isolation region.

2. The semiconductor structure of claim 1, wherein the width of the middle region is greater than a width of the gate stack along the second direction.

3. The semiconductor structure of claim 1, wherein the source and drain regions are doped with a first type dopant, and the middle region is doped with a second type dopant opposite from the first type dopant.

4. The semiconductor structure of claim 1, wherein the middle region includes a channel region and a doping feature, and the doping feature extends along a first edge of the channel region in the first direction.

5. The semiconductor structure of claim 4, wherein the channel region and the doping feature are doped with a same type dopant, and the doping feature has a higher doping concentration than the channel region.

6. The semiconductor structure of claim 4,
   wherein the doping feature separates an edge of the gate stack from the isolation region,
   wherein the edge extends along the first direction between two of the four corner portions.

7. The semiconductor structure of claim 4, wherein the doping feature is a low density doped (LDD) feature, and the middle region further includes a high density doped (HDD) feature that separates the LDD feature from the isolation region.

8. The semiconductor structure of claim 7, wherein the HDD feature includes a same type of dopant as the LDD feature, and the HDD feature has a doping concentration at least 10 times as high as that of the LDD feature.

9. The semiconductor structure of claim 7, wherein the LDD feature is shallower than the HDD feature in a vertical direction.

10. The semiconductor structure of claim 4, further comprising a gate spacer on sidewalls of the gate stack and directly above the doping feature.

11. A semiconductor structure, comprising:
    an active region over a substrate, the active region having a source region, a drain region, and a channel region between the source and drain regions along a first direction;
    an isolation region surrounding the active region;
    a gate stack over the channel region;
    a first doping feature separating a first edge of the gate stack from the isolation region along a second direction perpendicular to the first direction; and
    a second doping feature separating a second edge of the gate stack from the isolation region along the second direction,
    wherein the first and second doping features span between corner portions of the gate stack, and the corner portions of the gate stack are directly above the isolation region,
    wherein the channel region, the first doping feature, and the second doping feature are doped with a same dopant, and the first and second doping features have a higher doping concentration of the dopant than that of the channel region.

12. The semiconductor structure of claim 11, further comprising first and second gate spacers on sidewalls of the gate stack, wherein the first and second gate spacers are directly above the first and second doping features, respectively.

13. The semiconductor structure of claim 11, wherein the first doping feature extends continuously from the first edge of the gate stack to the isolation region along the second direction, and the second doping feature extends continuously from the second edge of the gate stack to the isolation region along the second direction.

14. The semiconductor structure of claim 11, further comprising a third doping feature separating the first doping feature from the isolation region, wherein the third doping feature has a higher concentration of the dopant than that of the first doping feature.

15. The semiconductor structure of claim 14, further comprising a fourth doping feature separating the second doping feature from the isolation region, wherein the fourth doping feature has a higher concentration of the dopant than that of the second doping feature.

16. The semiconductor structure of claim 14, wherein along the second direction, the first doping feature extends continuously from the first edge of the gate stack to the third doping feature, the third doping feature extends continuously from the first doping feature to the isolation region, and the second doping feature extends continuously from the second edge of the gate stack to the isolation region along the second direction.

17. A semiconductor structure, comprising:
    an active region over a substrate, the active region having a source region, a drain region, and a channel region between the source and drain regions along a first direction;
    an isolation region surrounding the active region;
    a gate stack over the channel region;
    a first doping feature separating a first edge of the gate stack from the isolation region along a second direction perpendicular to the first direction; and
    a second doping feature separating a second edge of the gate stack from the isolation region along the second direction,
    wherein the first and second doping features each includes a low density doped (LDD) feature, the LDD feature of the first doping feature extends to interface a first sidewall of the isolation region, wherein the second doping feature further includes a high density doped (HDD) feature with a doping concentration higher than that of the LDD feature, the HDD feature extends to interface a second sidewall of the isolation region.

18. The semiconductor structure of claim 17, wherein corner portions of the gate stack are directly above the isolation region, and wherein the first and second edges of the gate stack are between edges of the corner portions of the gate stack.

19. The semiconductor structure of claim 17, further comprising first and second gate spacers on sidewalls of the gate stack, wherein the first and second gate spacers are directly above the first and second doping features, respectively.

20. The semiconductor structure of claim 17,
wherein the source and drain regions are doped with a first type dopant,
wherein the channel region, the first doping feature, and the second doping feature are doped with a second type dopant opposite from the first type dopant,
wherein the LDD feature has a doping concentration at least twice as high as that of a channel region, and the HDD feature includes a doping concentration that is at least 10 times as high as that of the LDD feature.

* * * * *